United States Patent
Spinner et al.

(12)

(10) Patent No.: US 9,295,169 B1
(45) Date of Patent: Mar. 22, 2016

(54) COMMON CHASSIS FOR INSTRUMENTATION

(71) Applicants: Advanced Testing Technologies, Inc., Hauppauge, NY (US); Eli Levi, Dix Hills, NY (US)

(72) Inventors: Robert Spinner, East Northport, NY (US); Eli Levi, Dix Hills, NY (US); Richard Engel, Ridge, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 0 days.

(21) Appl. No.: 14/487,851

(22) Filed: Sep. 16, 2014

Related U.S. Application Data

(60) Provisional application No. 61/878,112, filed on Sep. 16, 2013, provisional application No. 61/902,475, filed on Nov. 11, 2013.

(51) Int. Cl.
*H01H 31/02* (2006.01)
*H05K 5/00* (2006.01)

(52) U.S. Cl.
CPC .................................. *H05K 5/0017* (2013.01)

(58) Field of Classification Search
CPC ............... H05K 7/1418; H05K 7/1439; Y10T 29/49117; G01R 31/2834; G11B 33/128; G06F 1/184
USPC ......................................................... 324/555
See application file for complete search history.

(56) References Cited

U.S. PATENT DOCUMENTS

| | | | |
|---|---|---|---|
| 4,486,816 A | 12/1984 | Hope | |
| 5,001,422 A | 3/1991 | Dahlberg et al. | |
| 5,237,484 A * | 8/1993 | Ferchau et al. | ............... 361/689 |
| 5,268,637 A | 12/1993 | Liken et al. | |
| 5,600,788 A | 2/1997 | Lofgren et al. | |
| 5,794,175 A | 8/1998 | Conner | |
| 5,896,473 A | 4/1999 | Kaspari | |
| 5,986,447 A | 11/1999 | Hanners et al. | |
| 5,986,458 A | 11/1999 | Saito et al. | |
| 5,989,037 A | 11/1999 | Ruque | |
| 5,991,163 A | 11/1999 | Marconi et al. | |
| 6,163,464 A | 12/2000 | Ishibashi et al. | |

(Continued)

FOREIGN PATENT DOCUMENTS

CA  2354181 A1  1/2003

OTHER PUBLICATIONS

Office Action for U.S. Appl. No. 14/695,106 dated Jun. 2, 2015.

*Primary Examiner* — Benjamin M Baldridge
(74) *Attorney, Agent, or Firm* — Brian Roffe

(57) ABSTRACT

Arrangement in an automated test system to connect to a plurality of functional modules of different forms including a common chassis defining a plurality of identical connectors and a backplane associated with the chassis and providing electrical connections for functional modules when engaged with the connectors. A set of adapters is provided including a first adapter having a coupling at an attachment end and a module receiving end configured to mate with one or more functional modules each having a first form, and a second adapter having a coupling at an attachment end and a module receiving end configured to mate with one or more functional modules each having a second form different than the first form. The couplings of the adapters are the same such that the adapters are freely insertable via their attachment ends into engagement with any of the connectors.

20 Claims, 6 Drawing Sheets

(56) References Cited

U.S. PATENT DOCUMENTS

| | | |
|---|---|---|
| 6,249,441 B1 | 6/2001 | Barbier et al. |
| 6,349,037 B1 | 2/2002 | Draughn et al. |
| 6,358,095 B1 * | 3/2002 | Rootz ................ G01R 31/2808 439/638 |
| 6,462,532 B1 | 10/2002 | Smith |
| 6,505,281 B1 * | 1/2003 | Sherry ................ G06F 3/0613 709/208 |
| 6,640,273 B1 | 10/2003 | Spisak et al. |
| 6,643,798 B2 * | 11/2003 | Barton ................ G06F 11/006 714/25 |
| 6,662,255 B1 | 12/2003 | Klein |
| 6,700,396 B1 | 3/2004 | Smith et al. |
| 6,757,177 B2 | 6/2004 | Harris et al. |
| 6,956,379 B2 | 10/2005 | Mastoris et al. |
| 6,975,130 B2 | 12/2005 | Yevmenenko |
| 6,981,086 B2 * | 12/2005 | Wetzel ................ G01D 21/00 710/300 |
| 6,989,902 B2 | 1/2006 | Maiaender et al. |
| 6,995,578 B2 | 2/2006 | Shibuya et al. |
| 7,075,796 B1 | 7/2006 | Pritchett |
| 7,092,253 B2 | 8/2006 | Lam |
| 7,138,733 B2 | 11/2006 | Sanders et al. |
| 7,149,093 B2 | 12/2006 | Conway |
| 7,212,412 B2 | 5/2007 | Carlson et al. |
| 7,242,590 B1 | 7/2007 | Yeap et al. |
| 7,254,025 B2 * | 8/2007 | Baldwin, Jr. ........ H05K 7/20672 361/688 |
| 7,272,774 B2 * | 9/2007 | Co ...................... G06F 11/2215 714/52 |
| 7,331,794 B2 | 2/2008 | Imbert et al. |
| 7,348,786 B2 | 3/2008 | Thacker et al. |
| 7,355,850 B2 | 4/2008 | Baldwin, Jr. |
| 7,362,089 B2 * | 4/2008 | Kushnick ......... G01R 31/31907 324/756.02 |
| 7,576,997 B2 * | 8/2009 | Brolin ................ H05K 7/1458 361/784 |
| 7,780,455 B2 | 8/2010 | Leigh et al. |
| 8,138,778 B1 * | 3/2012 | Smith ................ G01R 31/2808 324/756.02 |
| 8,446,722 B2 | 5/2013 | Fowler |
| 8,456,857 B2 | 6/2013 | Groeschner et al. |
| 8,656,229 B2 | 2/2014 | Elserougi et al. |
| 2002/0090844 A1 | 7/2002 | Kocin |
| 2006/0090100 A1 * | 4/2006 | Holzapfel ............ G06F 11/263 714/38.1 |
| 2007/0291905 A1 * | 12/2007 | Halliday ................ H04M 1/24 379/1.01 |
| 2009/0106761 A1 * | 4/2009 | Chandhoke .................... 718/103 |
| 2009/0219702 A1 * | 9/2009 | Mazura ................ H05K 7/1407 361/740 |
| 2010/0079151 A1 * | 4/2010 | Nordstrom et al. ........... 324/555 |
| 2011/0255574 A1 * | 10/2011 | Carter ................ H04L 29/04 375/214 |
| 2013/0201278 A1 * | 8/2013 | Chang ................ H04N 7/15 348/14.08 |
| 2013/0329392 A1 | 12/2013 | Czuba et al. |

* cited by examiner

COMMON CHASSIS FOR INSTRUMENTATION

CROSS REFERENCE TO RELATED APPLICATIONS

This application claims priority under 35 U.S.C. §119(e) of U.S. provisional patent application Ser. Nos. 61/878,112 filed Sep. 16, 2013 and 61/902,475 filed Nov. 11, 2013, both of which are incorporated by reference herein.

FIELD OF THE INVENTION

The present invention relates generally to automated test systems that utilize modular instrumentation that is intended to be housed within a standardized chassis.

BACKGROUND OF THE INVENTION

The evolution of test instrumentation has transitioned over the years from a situation where a single stand-alone box that would typically provide a single dedicated function to one where a multitude of standardized chassis now have the ability to house a plurality of modules, with each module providing a dedicated function so that with a single chassis, multiple functions can be provided.

Bulky test stations for testing complex pieces of equipment using a rack-and-stack approach have largely morphed into significantly smaller footprints through the use of the modular instrumentation. Rack-and-stack implementations may still be used where instrumentation dictates a stand-alone unit (i.e., a display) but over time, even units requiring displays have also gone 'faceless' to reduce complexity. The benefits of a modular approach are readily apparent, including for example, redundant functions (control, cooling, power) are eliminated which in turn results in a reduction of size and an increase in overall station reliability.

Over the past 30 years or more, a number of standardized chassis have been implemented including, but not limited to: MMS, Eurocard, VERSAbus, VMEbus, VXI, VPX, PCI, PXI and AXIe to name a few (the full terms of these abbreviations are known to those skilled in the art to which this invention pertains). While the modular approach has many benefits, one drawback is most systems typically have unused chassis space. Some systems intentionally allocate unused space for future expansion while in others, it is simply the result of how the system was populated. Over time, as existing instrumentation is deemed obsolete by the original equipment manufacturers (OEMs), it is often replaced by a different (or even new) modular form factor which might not be currently implemented within a test station.

SUMMARY OF THE INVENTION

An arrangement in an automated test system to connect to a plurality of functional modules of different forms in accordance with the invention includes a common chassis defining a plurality of identical connectors, a backplane associated with the chassis and providing electrical connections for functional modules when engaged with the connectors, a first adapter having a coupling at an attachment end and a module receiving end configured to mate with a functional module having a first form, and a second adapter having a coupling at an attachment end and a module receiving end configured to mate with at least one functional module each having a second form different than the first form. The couplings of the first and second adapters are the same such that the first and second adapters are freely insertable via their attachment ends into engagement with any of the connectors.

In one embodiment, the module receiving end of the first adapter is configured to mate with a VXI module, while the module receiving end of the second adapter is configured to mate with at least one PXI module. The module receiving end of one or both of the adapters may be configured to mate with a plurality of the same functional modules.

In one embodiment, the first adapter has different signal processing circuitry than the second adapter, which signal processing circuitry is related to the form of functional module mating with the first or second adapter. For example, when the module receiving end of the first adapter is configured to mate with a VXI module, the signal processing circuitry of the first adapter is configured to terminate signals other than those necessary for use of the VXI module. When the module receiving end of the second adapter is configured to mate with at least one PXI module, the signal processing circuitry of the second adapter is configured to terminate signals other than those necessary for use of the PXI modules.

In light of the foregoing arrangement, the invention also encompasses a set of adapters for interfacing between a chassis of an automated test system and functional modules of different forms. This set includes a first adapter having a coupling at an attachment end and a module receiving end configured to mate with a functional module having a first form, and a second adapter having a coupling at an attachment end and a module receiving end configured to mate with at least one functional module each having a second form different than the first form. The couplings of the first and second adapters are the same such that the first and second adapters are freely insertable via their attachment ends into engagement with any of a plurality of identical connectors of the chassis of the automated test instrument. The same variations of the adapters mentioned above are applicable here as well.

Further, building on the foregoing, the invention also encompasses a chassis for an automated test system. The chassis includes a housing having walls defining an enclosure, a plurality of identical connectors, each having a unique identification, and a backplane arranged in the housing that provides electrical connections for a plurality of functional modules of different forms when engaged with the connectors. The backplane includes electrical circuitry to enable signals to be provided for all of the functional modules, i.e., a variety of different functional modules can all be arranged within the housing and mated to the same backplane. To this end, the backplane preferably comprises common signal lines additional to a minimum number of signal lines needed to support all of the functional modules. Further, the backplane may be configured to provide an address bus, a data bus, a trigger bus, an interrupt bus, a local bus, clock and power signals and slot identification signals. The backplane may be configured to source all voltages required by the functional modules. In one embodiment, a cooling system is provided to satisfy cooling requirements of the functional modules.

An adapter for enabling use of at least one smaller functional module in at least one slot of a chassis designed to mate with a larger functional module having a different standard than the smaller functional module in accordance with the invention includes a housing having electrical connections adapted to mate with electrical connections provided by the chassis for the larger functional module and dimensions that fit within at least one slot provided by the chassis for housing the larger functional module. The housing includes at least one set of electrical connections adapted to mate with the electrical connections of the at least one smaller functional module. The housing further includes at least one air passage for conveying air from an opening of the chassis that provides air flow to cool the larger functional module to an area in which the at least one smaller functional module is situated when mated with the housing.

The housing optionally includes electrical wiring or componentry that functionally separates or isolates address and/or data signals being received at the at least one set of electrical connections provided by the chassis that are not needed at the at least one set of electrical connections adapted to mate with the electrical connections of the at least one smaller functional module.

A control system enables user selection of auxiliary signals being transferred between the chassis and the at least one smaller functional module. A signal conditioning system conditions auxiliary signals being transferred between the chassis and the at least one smaller functional module. At least one booster fan increases air flow to the area in which the at least one smaller functional module is situated when mated with the housing. A power altering system alters transfer of electrical power from the chassis to the at least one smaller functional module. The power altering system may include a DC-DC converter. The power altering system may be user configurable. Additionally or alternatively, the power altering system includes a switch and a connection for external power and/or a power supply on the housing.

The housing may include two sets of electrical connections each adapted to mate with the electrical connections of a respective one of two smaller functional modules and has dimensions that fit within a single slot provided by the chassis for housing a single one larger functional module.

For example, the housing may include eight sets of electrical connections each adapted to mate with the electrical connections of a respective one of eight smaller functional modules and has dimensions that fit within three slots provided by the chassis for housing three of the larger functional modules.

A method for enabling use of at least one smaller functional module in at least one slot of a chassis designed to mate with a larger functional module having a different standard than the smaller functional module in accordance with the invention includes connecting electrical connections of a housing to electrical connections provided by the chassis for the larger functional module, the housing having dimensions that fit within at least one slot provided by the chassis for housing the larger functional module, and connecting each of at least one smaller functional module to a respective set of electrical connections on the housing. The method also includes conveying air from an opening of the chassis that provides air flow to cool the larger functional module through at least one air passage of the housing to an area in which the at least one smaller functional module is situated.

Optionally, the method includes separating or isolating address and/or data signals being received at the at least one set of electrical connections provided by the chassis that are not needed at the at least one set of electrical connections connected to the electrical connections of the at least one smaller functional module by means of electrical wiring or componentry.

Optionally, the method includes enabling user selection of auxiliary signals being transferred between the chassis and the at least one smaller functional module, and/or conditioning auxiliary signals being transferred between the chassis and the at least one smaller functional module. Air flow to the area in which the at least one smaller functional module is situated may be increased. Transfer of electrical power from the chassis to the at least one smaller functional module may be altered.

An arrangement in accordance with the invention includes an automated test equipment chassis defining at least one slot for a larger functional module, and an adapter that enables use of at least one smaller functional module in the at least one slot that has a different standard than the larger functional module. The adapter includes a housing having electrical connections adapted to mate with electrical connections provided by the chassis for the larger functional module and dimensions that fit within the at least one slot. The housing includes at least one set of electrical connections adapted to mate with the electrical connections of the at least one smaller functional module. The housing further includes at least one air passage for conveying air from an opening of the chassis that provides air flow to cool the larger functional module to an area in which the at least one smaller functional module is situated when mated with the housing.

The invention will be described in detail with reference to some preferred embodiments of the invention illustrated in the figures in the accompanying drawings. However, the invention is not confined to the illustrated and described embodiments alone.

BRIEF DESCRIPTION OF THE DRAWINGS

Additional objects of the invention will be apparent from the following description of the preferred embodiment thereof taken in conjunction with the accompanying non-limiting drawings, in which.

DETAILED DESCRIPTION OF THE INVENTION

Figure 1:
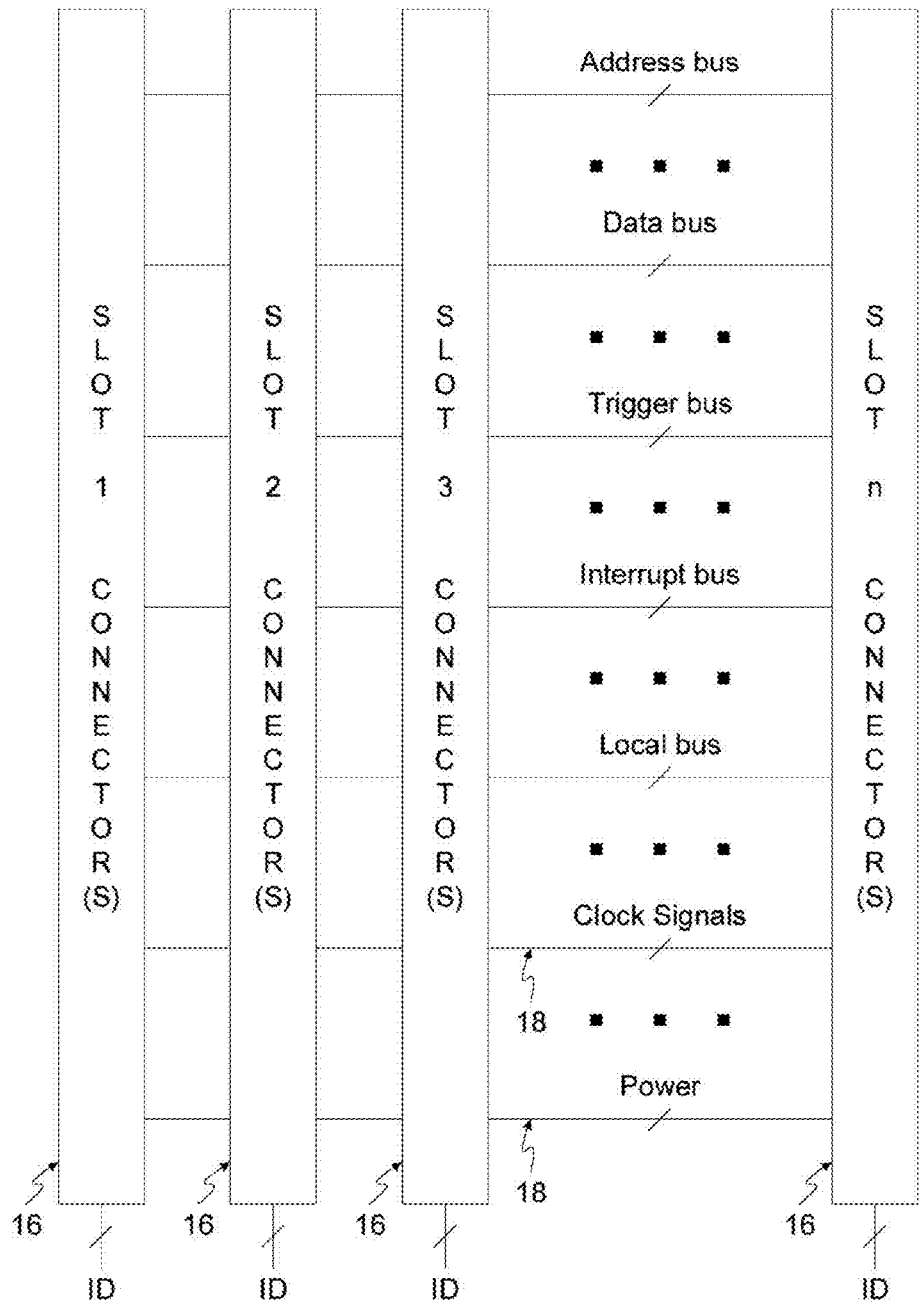
FIG. 1 shows the electrical interface configuration of the common chassis.

This invention relates to a chassis for instrumentation or an instrumentation chassis within a module. However, to enumerate each and every chassis permutation ad nauseam serves no practical purpose, so for the sake of clarity and convenience, the descriptions herein will be limited to VXI and PXI modules due to their ubiquitous presence throughout the test instrumentation industry. The invention is in no way constrained to using only these form factors/standards or modules and to those skilled in the art could readily adapt current and future standardized chassis to a similarly configured common chassis, in view of the teachings disclosed herein.

Preferred embodiments of the invention will be described with reference to FIGS. 1-3 wherein like reference numerals refer to the same or similar elements. In order to implement a chassis capable of supporting a plurality of the chassis standards within a single chassis, one must first look at the physical module sizes that are needed to be supported. In terms of physical sizing of the chassis, the largest of each dimension (height, width, depth) across all modules will be the key determining factor and roughly dictate the size of the chassis.

Figure 2:
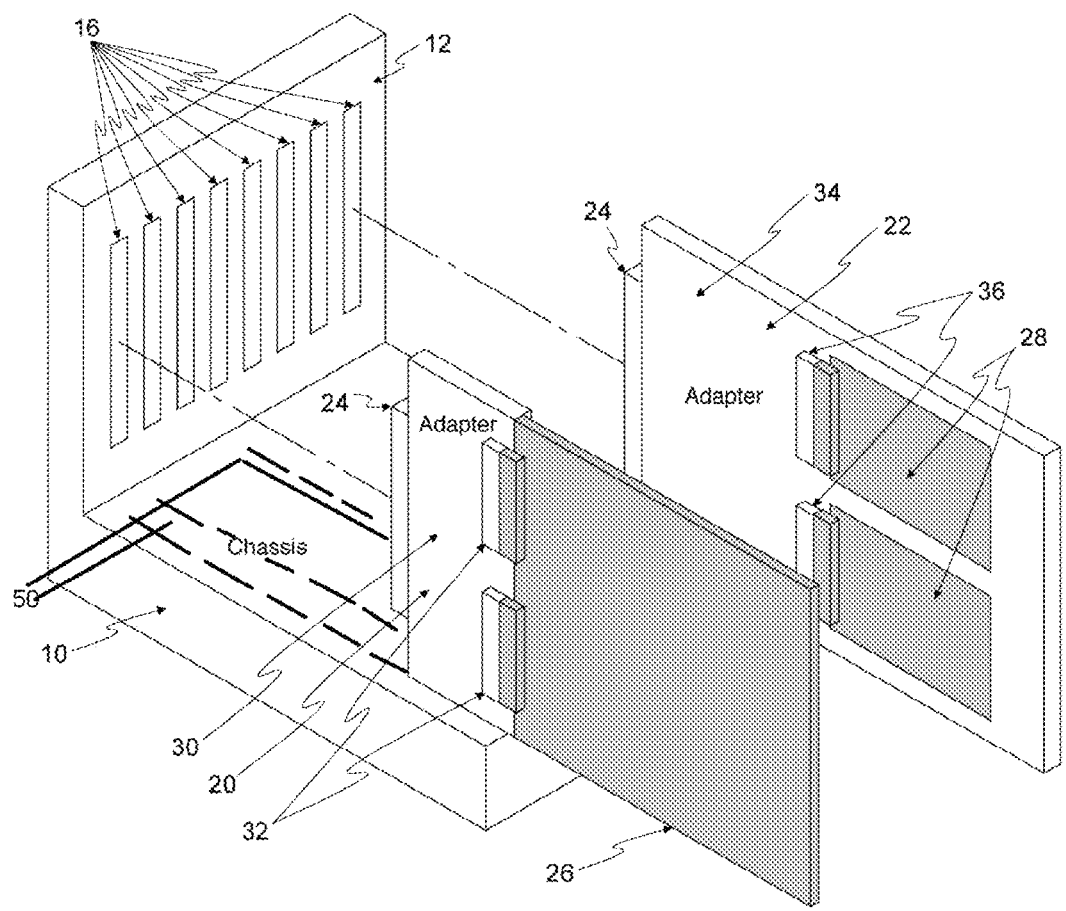
FIG. 2 reflects how the common chassis will physically mate with various types of module standards/form factors.

The common chassis 10 must contain an electrical backplane 12 that distributes all requisite power and signals across module slots defined by connectors 16 of the chassis 10 (see FIG. 2). The common chassis 10 is essentially a housing with an opening on one side through which functional modules are inserted and pressed into engagement with the connectors 16. FIG. 2 shows only a substantially L-shaped portion of the chassis 10, with the side and top panels removed for clarity. In the orientation shown in FIG. 2, the chassis 10 includes a horizontally oriented support portion and a vertically oriented receiving portion on which the connectors 16 are situated. The common chassis 10 may have different shapes and forms and be oriented differently.

The particular structure of this backplane 12 and how it distributes power and signals across a plurality of connectors 16, including buses identified in FIG. 1, is known to those skilled in the art to which this invention pertains and additional details are therefore not set forth. Differing from the prior art, in terms of electrical compatibility, the total signal count across all module types to be supported by the chassis 10 must be examined and implemented along with approximately an additional 10-20% signal capacity which can serve as common signal lines between the standards or allow for an additional standard not initially defined upfront. Particular importance must be given to isolation, signal crosstalk, impedance and current capacity across the different signal types.

Signals that must be supported include, but are not limited to (not an exhaustive list): address bus, data bus, trigger bus, interrupt bus, local bus, clock signals and slot identification signals. As shown in FIG. 1, for a backplane 12 with n slots, there would be n connectors 16, each with a distinctive identification (ID). The signals are provided to each of the connectors 16, e.g., the address bus, data bus, trigger bus, interrupt bus, local bus, clock and power, through electrical conduits, not shown, such as wiring in a manner known to those skilled in the art to which this invention pertains.

The common chassis 10 would also need to source all voltages required by all of the card types being used within the chassis 10. In a preferred embodiment, all voltages sourced by the common chassis 10 would essentially be available to all standards/form factors. Instrumentation that may be subjected to harsh environments or operate in sensitive environments may necessitate the need for other embodiments in which multiple isolated voltage sources are available within the common chassis 10 and are dedicated for use on a single standard/form factor.

Cooling requirements must also be evaluated to insure that a fully populated common chassis 10 meets the cooling requirements of the various modules that will be housed within it. To this end, the chassis 10 includes an internal cooling system (not shown in FIG. 2 but which may be situated in the horizontally oriented portion on which the adapters 20, 22 rest) that is configured to satisfy the cooling requirements of all of the different forms or types of functional modules used with the chassis 10. Structure that provides cooling is described below with reference to FIG. 5 in particular.

Thus, the various different cooling requirements of the function modules potentially used with the chassis 10 would be analyzed and the cooling system designed to meet most if not all of the requirements. Otherwise, use of the chassis 10 with all of the different functional modules would be limited to only those whose cooling requirements are satisfied by the cooling system. Air flow may be directed upward from the horizontally oriented portion along the surfaces of the adapters 20, 22.

The backplane interface of the common chassis 10 may be implemented as a large single connector or a plurality of smaller connections as the application, or user preference, dictates.

The modular instrumentation interfaces to the common chassis 10 through a common chassis adapter 20, 22 that may rest on the horizontal support portion of the chassis 10 (see FIG. 2). This adapter 20, 22 serves multiple purposes and each adapter 20, 22 is typically specific to one standard/form factor. One purpose of the adapter 20, 22 is the physical attachment to the common chassis 10, namely, to the connector 16. To this end, the attachment end of each adapter 20, 22 is provided with a suitable coupling or engaging structure 24, also referred to herein as a connector, that mates with the connecter 16 (see FIG. 2).

Referring back to the VXI and PXI implementations and again to FIG. 2, a single slot VXI adapter 20 would have the ability to mate the common chassis 10 with a single slot VXI module 26. The adapter 20 may optionally include a housing 30 having the coupling structure 24 at one end and one or more electrical connectors 32 that are necessary to mate with or otherwise receive the VXI module 26.

A single slot PXI adapter 22 would have the ability to mate the common chassis 10 with two single slot PXI modules 28 as a result of the relative difference in physical form factors (the PXI modules being smaller than one VXI module). The adapter 22 may optionally include a housing 34 having the coupling structure 24 at one end and two electrical connectors 36 that are necessary to mate with or otherwise receive a respective one of the PXI modules 28. The housing 32 may be as shown with two interior apertures, slots or receptacles into which the PXI modules 28 are installed.

Due to large number of standards, there may not exist a single common chassis 10 that will support all variants simultaneously due to the varying degrees of dissimilar physical form factors. Thus, two or more common chassis may be provided, each designed for use with a set of modules.

Considered in a generic manner, a common adapter is configured for each different standard/form factor to mate at a receiving end with one or more of the functional modules associated with that standard/form factor and at the attachment end with the same coupling, engagement or attachment structure needed to mate with the chassis 10, i.e., to engage with one of the connectors 16 associated with the backplane 12 of the chassis 10 and be electrically coupled thereto for signal flow.

A second function of the common chassis adapter is to direct the cooling airflow of the common chassis over the modules retained by the adapter, described below with reference to FIGS. 4-6. Since different chassis standards have different form factors and cooling requirements, these differences are addressed in the design of the common chassis adapter. With reference to the VXI and PXI modules, the cooling specification per slot is approximately 40 watts and 25 watts respectively, both utilizing a vertical flow of forced air. In order to accommodate a single VXI module or two PXI modules as proposed, the universal chassis 10 would need to provide 50 watts of cooling per slot.

The chassis adapter would provide a method and structure of ducting airflow from the universal chassis 10, i.e., from air flow ports of the chassis 10, to the air inlet location of whatever standard is desired. Thus, ducting structure may be integral with the adapter 20, 22 or otherwise formed in connection therewith to guide air flow over the outer surfaces of the adapters 20, 22 and associated modules. The bottom portion of the chassis 10 may include one or more ducts or other air flow structure to bring air from an external source of the adapters 20, 22 (see FIG. 5).

A third function of the common chassis adapter is the transitioning of the full complement of signals present on the common chassis backplane 12 to the appropriate subset of signals required by a particular module's form factor standard (VXI, PXI, et al.). In a preferred embodiment, the common chassis adapter 20, 22 is an electrically passive element. Other embodiments may need to implement active circuitry to perform signal conditioning and/or level translation to insure compatibility between the signals of the various standards implemented within the common chassis 10.

Signals present on the backplane that are not utilized by the standard would be terminated or isolated in the common chassis adapter 20, 22 to prevent commingling of signals. If these signals were left un-terminated, it could result in undesirable behavior of any one of the modules housed within the common chassis 10 due to excessive crosstalk and interference. In particular, address and data buses between standards/form factors must remain isolated from one another in order to avoid contention between control functions of the different standards.

In a preferred embodiment, the various clock signals used by the different standards/form factors would be sourced from an active clock distribution system to insure high isolation/buffering. Other embodiments that do not require high isolation may use simpler passive or active circuits for sourcing these clock signals. The remaining buses may remain isolated between the different standards/form factors although in a preferred embodiment, a small plurality of trigger, interrupt and local bus signals may be configured by the user to interact between the different standards/form factors through the use of a switch selection in the common chassis adapter. This is reflected in general terms in FIG. 3.

Figure 3:
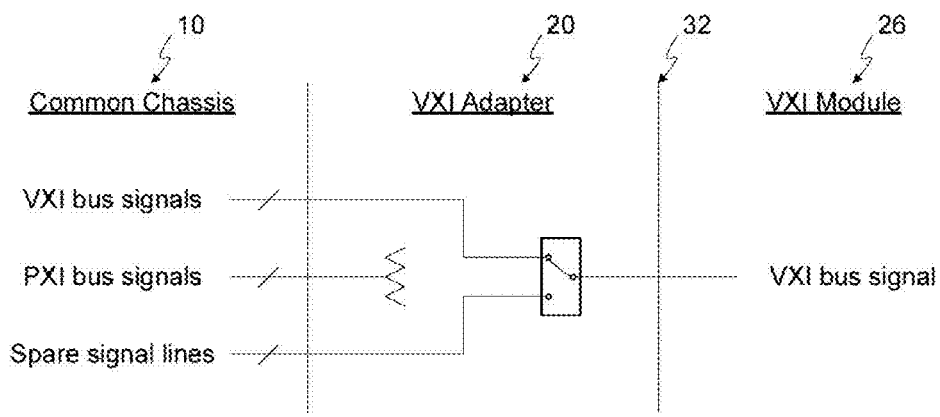
FIG. 3 shows how signal interaction can be configured between module standards/form factors.
Figure 3:
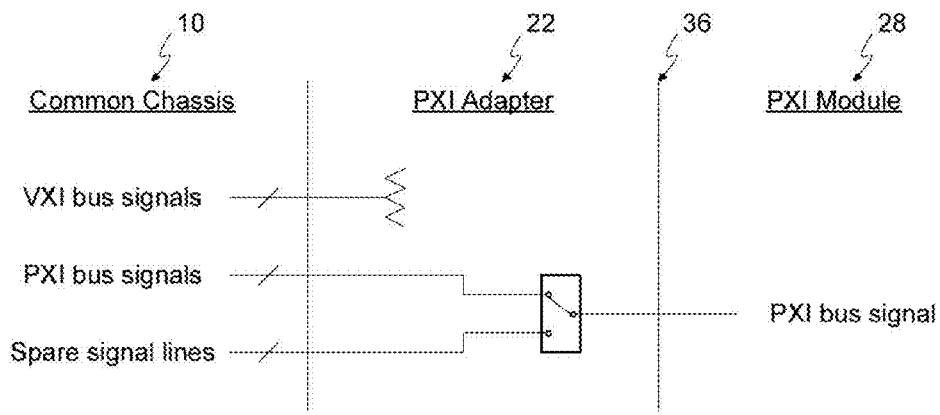

As shown in FIG. 3, the common chassis 10 provides sufficient signal density to support VXI bus signals, PXI bus signals and has spare signal lines for other signals. However, when the VXI adapter 20 is constructed, it is internally constructed to terminate the signals utilized by the PXI bus and switch between the VXI bus signals and the spare signal lines via a switch to generate the VXI bus signals to be provided to the VXI module 26. This internal terminating and switching construction may be any known to those skilled in the art to which this invention pertains.

Similarly, when the PXI adapter 22 is constructed, it is internally constructed to terminate the signals utilized by the VXI bus and switch between the PXI bus signals and the spare signal lines via a switch to generate the PXI bus signals to be provided to the PXI module(s) 28. This internal terminating and switching construction may be any known to those skilled in the art to which this invention pertains.

Figure 4:
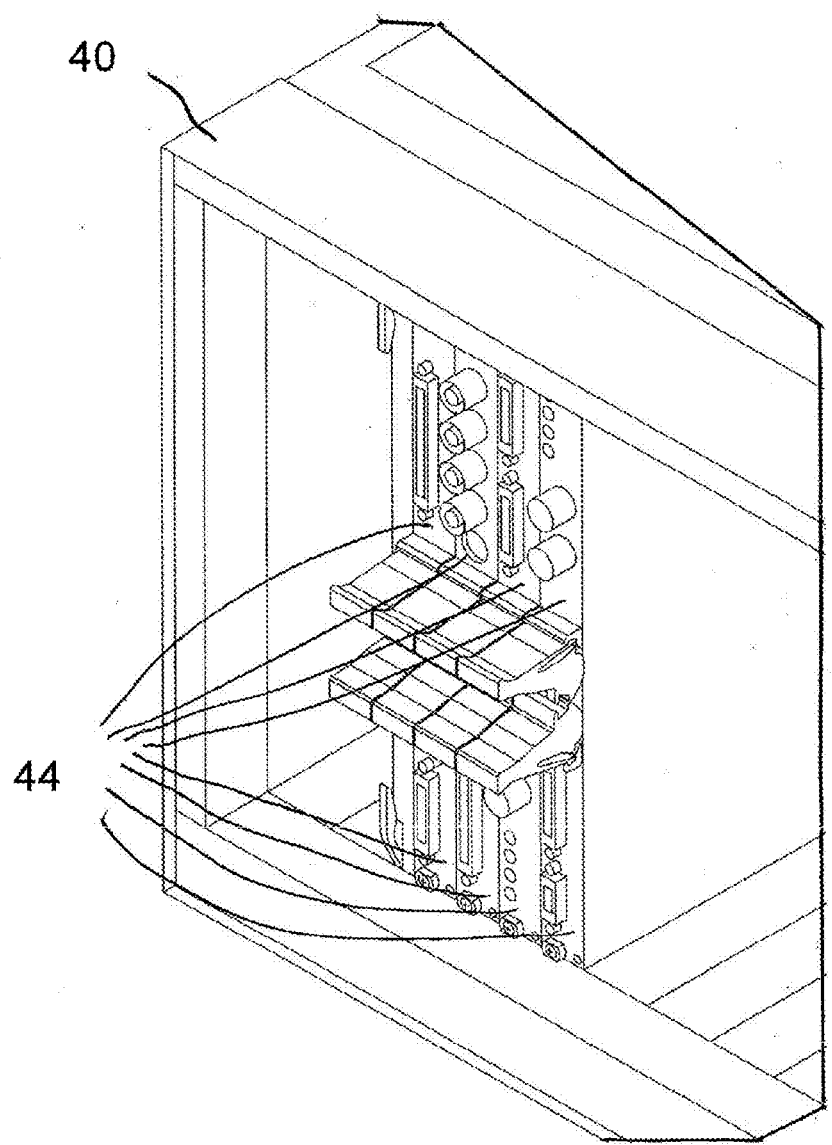
FIG. 4 shows an exemplifying, non-limiting physical implementation of a chassis within a module configuration.
Figure 5:
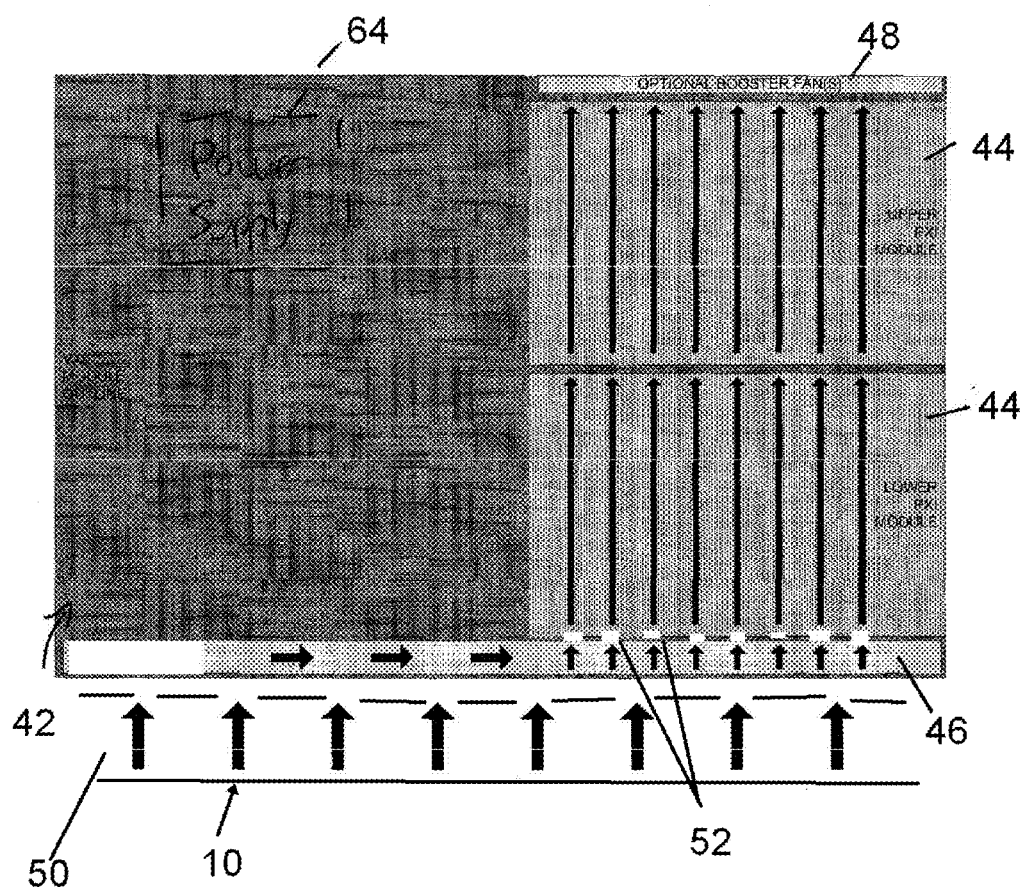
FIG. 5 shows a side view of the installation of two smaller module within a chassis having the physical properties of a larger chassis and reflects how cooling air is directed through the assembly.
Figure 6:
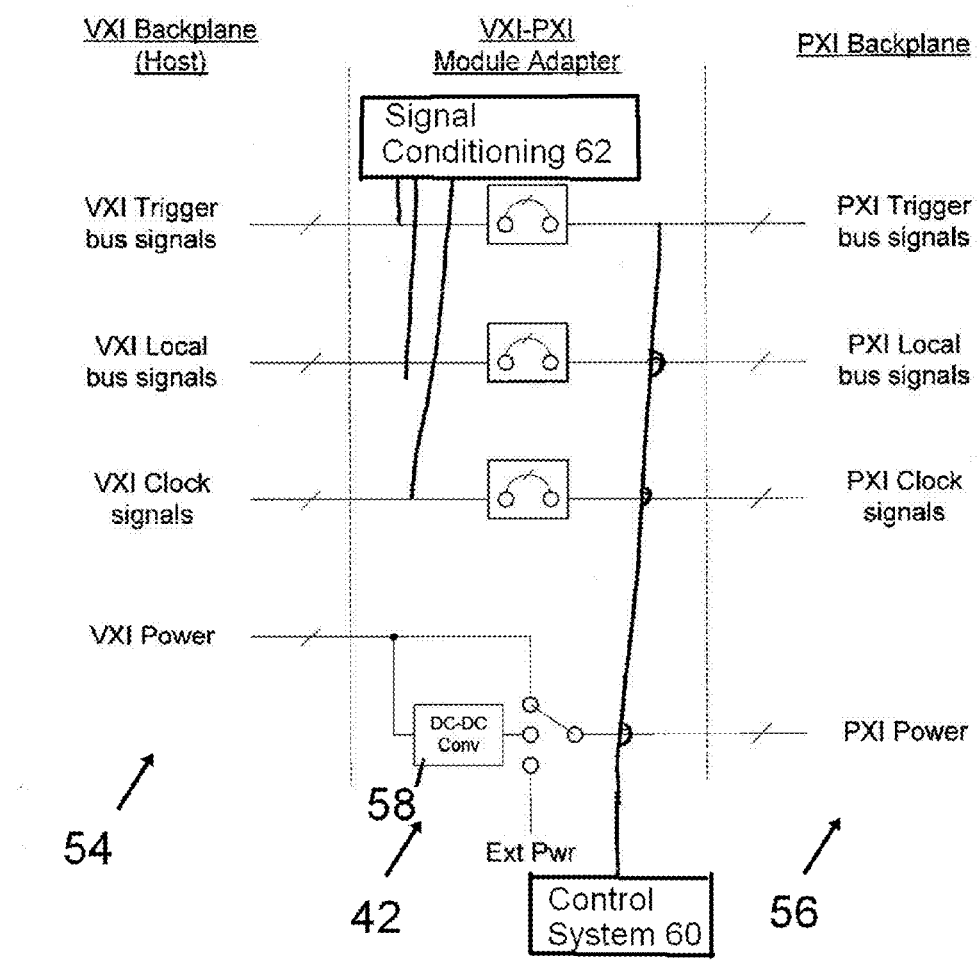
FIG. 6 reflects how signal interaction can be configured between the main chassis and the chassis with the module adapter.

Referring now to FIGS. 4-6, in an effort to reclaim unused space, as mentioned above, an intent of some embodiments of the invention is to implement a standardized chassis within a module of a dissimilar standardized chassis in a sort of commensal symbiotic relationship. As noted above, in order to implement a chassis within a module, the physical module sizes that are needed to be supported by the equipment 40 must first be determined, and in terms of physical sizes, the larger dimension (height, width, depth) of the desired modules will be the key determining factor as to how the adapter is implemented.

For explaining FIGS. 4-6, the adapter will be considered a housing having the size of a larger module and configured to retain one or more of the smaller modules, providing electrical connectivity and physical fit for the smaller module(s) within a chassis designed to receive the larger module. Otherwise, the smaller module(s) could not be used with the chassis since their size and connections do not correspond to those provided by the chassis.

As an example, if it is desired to use both PXI and VXI modules, the typical PXI modules are roughly half the height of a typical VXI module and are an ideal candidate to be housed within the confines of a housing having the properties of a (larger) VXI module. The larger VXI housing essentially becomes an outer chassis (or intermediate chassis considering the automated test equipment 40 or system to be the main chassis) whereas the PXI chassis (smaller) becomes an inner chassis. Equipment 40 will also be referred to as VXI chassis since it is designed to receive VXI modules.

FIG. 5 shows such as an adapter 42 which has the shape and electrical connections of a VXI module, but is designed to retain two PXI modules 44 (similar in most respects to adapter 22 and PXI modules 28 described above). A PXI adapter resident within an envelope of a single slot VXI module is capable of housing two PXI slots and thus two PXI modules (see FIGS. 2 and 5). An adapter having the properties of a double slot VXI module is capable of housing four (or possibly six) PXI slots and thus four or six PXI modules. An adapter having the properties of a triple slot VXI module (as shown in FIG. 4) is capable of housing eight PXI slots and modules 44 therein, with wider modules housing even greater capacities. FIG. 4 reflects the lower module inverted from its normal orientation for space considerations. The invention is not limited by such orientation and in alternate embodiments, the PXI modules 44 may be oriented differently.

With reference to the VXI and PXI modules, the cooling specification per slot is 40 watts and 25 watts respectively. Structure may be provided in the adapter 20, i.e., the adapter having the properties of a VXI module, to enable cooling of the PXI modules 44 placed into PXI-compatible slots defined by the adapter 42.

Since both standards utilize forced airflow cooling that pass across the module vertically, incorporating a PXI chassis within the footprint of an adapter having the properties of a VXI module is easily accommodated through the use of interior ducts to direct airflow as shown in FIG. 5. Specifically, a main air duct 46 is formed in the adapter 42. This main air duct 46 has openings along a bottom area to receive the airflow (represented by the large arrows directed upward) from one or more ducts 50 of the VXI chassis or other equipment 40 that is housing the adapter 42. To this end, the bottom portion of the chassis 10 may be provided with one or more air ducts 50 as mentioned above (see FIG. 2 which shows two elongate air ducts or passages, there being any number of such ducts in different embodiments of the invention).

The backplane of the equipment 40 includes slots in which connectors are arranged (see elements 12 and 16 in FIG. 2) and thus, the equipment includes the elongate module passages 50. Each module passage 50 aligns with a respective slot and is configured to be situated alongside a respective adapter 42 when engaged with the connector of the respective slot. The module passages 50 may be interconnected to allow for supply of air to all of the module passages from a common inlet of air into the equipment 40 or chassis.

The main air duct 46 of the adapter 42 also includes openings 52 along a top that lead to areas of the adapter 42 in which the PXI modules 44 will be positioned. The air flow thus flows laterally alongside the broad surfaces of the PXI modules 14 (represented by the long, narrow arrows).

Since the cooling capacity provided by the VXI chassis or other equipment 10 for a VXI module normally housed in the VXI slot (40 watts) is not twice that of the cooling required by a PXI module in a PXI slot (25 watts), the cooling capacity of the upper/lower PXI module pair would normally be limited to 40 watts instead of 50 watts or roughly 80% of the normal PXI rating.

In a preferred embodiment, an optional plurality of booster fans 48 may be used to increase the airflow across the PXI modules 44 so that no cooling de-rating would be necessary. These booster fans 48 may be placed in-line (serially) or placed in such a manner to pump additional airflow into the lower, main air duct 46 to augment the airflow from the VXI chassis or other equipment 40. Other implementations of a chassis within a module would require similar analysis of physical constraints and airflow requirements, and placement of optional airflow boosting structure to augment the airflow if necessary or desired.

Accordingly, the adapter 42 optionally includes mounting structure (not shown) to mount one or more of the booster fans 48 above the spaces defined by the adapter 42 for receiving the PXI modules 44.

In terms of electrical compatibility, the intent is to generally isolate the signals present within the VXI chassis or other equipment 40 from those within the PXI modules 44 to prevent commingling of signals. Specifically, address and data buses between standards/form factors must remain isolated from one another in order to avoid contention between control functions of the VXI chassis and PXI chassis. Each chassis would have its own dedicated controller to make use of existing and plentiful hardware while also minimizing compatibility issues. Particular importance must be given to isolation, signal crosstalk, impedance and current capacity across the different signal types needed to support the new chassis. There are instances where it might prove beneficial to allow limited interaction between the VXI chassis and the PXI chassis.

In a preferred embodiment, the user would be able to configure/select one or more trigger bus signals to pass through the VXI-PXI module adapter 42 to allow triggering between instrumentation. This may hold true for local bus signals as well. To this end, the electrical componentry in the adapter 42 may be controlled or programmed by the user to provide for the user selectability of the trigger bus signals. This control aspect is represented schematically as 60 in FIG. 6, and may be implemented by control systems known to those skilled in the art. For example, a command signal may be generated by control system 60 and directed to the adapter 42 to effect the desired user control of the trigger bus signals.

Embodiments for other chassis standards/form factors may need to implement active circuitry to perform signal conditioning and/or level translation to insure compatibility between the signals of the chassis to be used. To this end, a signal conditioning system 62 may be housed on or associated with the adapter 42 and coupled to one or more of the signals being transferred between the VXI chassis or other equipment 40 and the PXI modules 44.

Referring still to FIG. 6, the VXI chassis or other equipment 40 includes a VXI backplane (host) 54 which is wired to provide auxiliary signals, such as VXI trigger bus signals, VXI local bus signals, VXI clock signals, and VXI power. These signal connections would normally connect to respective corresponding signals paths and connectors on a VXI module if housed in the VXI chassis. Indeed, since the VXI chassis or other equipment 40 may include a plurality of VXI slots, it is conceivable that one of these slots is occupied by a VXI module and another one of the slots is occupied by the adapter retaining two PXI modules. The VXI chassis or other equipment is therefore useful for retaining multiple, different types of modules.

When used with the adapter 42 however, the adapter 42 includes various electrical connections and/or components to convert the various signals and provide suitable PXI connections on a PXI backplane 56 defined by the adapter 42. Thus, the VXI trigger signals are converted to PXI trigger signals, the VXI local bus signals are converted to PXI local bus signals and the VXI clock signals and converted to PXI clock signals. Also, the VXI power is converted to PXI power, possibly with use of an external power source and a DC-DC converter 58.

More specifically, for clock distribution, any clocks present within the outer VXI chassis or other equipment 40 could be passed to the PXI module 44 through adapter 42 in instances where coherent timing is necessary. In a preferred embodiment, the various clock signals sourced by the PXI module 44 would be routed through an active clock distribution system to insure high isolation/buffering between the VXI chassis or other equipment 40 and the PXI modules 44 and may optionally include clock multiplier/divider circuitry to keep clocks of different frequencies coherent between the VXI chassis or other equipment 40 and the PXI modules 44.

Alternative embodiments that do not require high isolation may use simpler passive or active circuits for sourcing these clock signals. Such active clock distribution systems and passive or active circuits for sourcing clock signals would be readily available or constructable by those skilled in the art to which this invention pertains in view of the disclosure herein.

The PXI chassis power supply specifications require voltages of +5 VDC, +3.3 VDC, +12 VDC and –12 VDC. Older VXI chassis (prior to revision 4.0 of the VXI specification) have sufficient current capacity to support the +5 VDC, +12 VDC and –12 VDC requirements but were not required to include a +3.3 VDC power rail. VXI chassis that satisfy revision 4.0 have include additional pins that accommodate the +3.3 VDC power rail. In a preferred embodiment, all voltages required by the PXI modules 44 could be user configured within the module adapter 42 as to where each voltage is derived from. The most direct implementation would utilize power sourced directly from the VXI chassis or other equipment 40. Instrumentation that may be subjected to harsh environments or operate in sensitive environments may necessitate the need for other embodiments in which multiple isolated voltage sources are implemented through the use of DC-DC converters. In cases where the PXI modules requires a voltage not available within the VXI chassis or other equipment, this voltage can be created through the use of the DC-DC converter 58 or even a power supply 64 that resides within the module chassis adapter 42 (see FIG. 5).

In an alternative embodiment, voltages for use within the PXI modules 44 could be configured to utilize one or more external sources of DC power or implement dedicated power supplies within the module chassis adapter 42. This is reflected in general terms in FIG. 6.

With the structure described above, the invention allows for specific advantages to be obtained, including configuring a common chassis capable of supporting a plurality of standardized instrumentation chassis through the use of module adapters, addressing the issue with standardized chassis described above through the use of a common chassis that can accommodate more than one type of modular standard, and configuring a chassis that is capable of being installed within a larger chassis of a different form factor through the use of a specialized module.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting. The invention is limited only as defined in the claims and equivalents thereto.

The invention claimed is:

1. An arrangement in an automated test system to connect to a plurality of functional modules of different forms and having different supporting signals, comprising:
   a common chassis having a plurality of identical connectors;
   a backplane associated with said chassis and providing electrical connections for a plurality of different functional modules when, at the same time, the functional modules are each electrically engaged with a respective one of said connectors, said backplane including electrical circuitry to enable signals to be provided simultaneously for all of the functional modules when, at the same time, the functional modules are each engaged with a respective one of said connectors, said backplane further comprising common signal lines additional to a minimum number of signal lines needed to support all of the functional modules when each is engaged with a respective one of said connectors, and said backplane is configured to provide an address bus, a data bus, a trigger bus, an interrupt bus, a local bus, clock and power signals and slot identification signals and to source all voltages required by the functional modules when each is engaged with a respective one of said connectors;
   a first adapter having a coupling at an attachment end and a module receiving end configured to mate with at least one functional module each having a first form; and
   a second adapter having a coupling at an attachment end and a module receiving end configured to mate with at least one functional module each having a second form different than said first form such that said module receiving end of said second adapter is different than said module receiving end of said first adapter and the at least one functional module having the second form is able to mate with said module receiving end of said second adapter but not said module receiving end of said first adapter while the at least one functional module having the first form is able to mate with said module receiving end of said first adapter but not said module receiving end of said second adapter,
   said couplings of said first and second adapters being the same such that said first and second adapters are insertable via their attachment ends into engagement with each of said connectors alternatingly or with respective first and second ones of said connectors at the same time to thereby electrically connect the at least one functional module having the first form and the at least one functional module having the second form to said backplane at the same time.

2. The arrangement of claim 1, wherein said module receiving end of said first adapter is configured to mate with a VXI module such that the VXI module constitutes the at least one functional module having the first form.

3. The arrangement of claim 1, wherein said module receiving end of said second adapter is configured to mate with at least one PXI module such that the at least one PXI module constitutes the at least one functional module having the second form.

4. The arrangement of claim 1, wherein said module receiving end of said second adapter has a plurality of electrical connectors and is configured to mate simultaneously with a plurality of the same functional modules of the second form each being connected to a respective one of said plurality of electrical connectors at said module receiving end of said second adapter.

5. The arrangement of claim 1, wherein said first adapter has different signal processing circuitry than signal processing circuitry of said second adapter, said signal processing circuitry of said first and second adapters being related to the form of functional module mating with said first or second adapter.

6. The arrangement of claim 5, wherein said module receiving end of said first adapter is configured to mate with a VXI module such that the VXI module constitutes the at least one functional module having the first form, and said signal processing circuitry of said first adapter is configured to terminate signals other than those necessary for use of the VXI module.

7. The arrangement of claim 5, wherein said module receiving end of said second adapter is configured to mate with at least one PXI module such that the at least one PXI module constitutes the at least one functional module having the second form, and said signal processing circuitry of said second adapter is configured to terminate signals other than those necessary for use of the PXI modules.

8. The arrangement of claim 1, wherein said chassis includes at least one passage through which air is conveyable to an opening of the said chassis leading to a location alongside said first adapter to thereby enable air flow through said chassis to cool said first adapter.

9. The arrangement of claim 8, wherein said first adapter includes a duct having openings leading to an area in which the at least one functional module having the first form is situated when mated with said first adapter, said opening of the said chassis leading to an opening aligning with said duct.

10. The arrangement of claim 9, wherein said first adapter further comprises at least one booster fan for increasing air flow to the area in which the at least one functional module having the first form is situated when mated with said first adapter.

11. A set of adapters for interfacing between a chassis of an automated test system and functional modules of different forms and having different supporting signals, the chassis including a backplane providing electrical connections for a plurality of different functional modules when, at the same time, the functional modules are each electrically engaged with a respective one of a plurality of identical connectors of the chassis, the backplane including electrical circuitry to enable signals to be provided simultaneously for all of the functional modules when, at the same time, the functional modules are each engaged with a respective one of the connectors, the backplane further comprising common signal lines additional to a minimum number of signal lines needed to support all of the functional modules when each is engaged with a respective one of the connectors, and the backplane being configured to provide an address bus, a data bus, a trigger bus, an interrupt bus, a local bus, clock and power signals and slot identification signals and to source all voltages required by the functional modules when each is engaged with a respective one of the connectors, the set of adapters comprising:
   a first adapter having a coupling at an attachment end and a module receiving end configured to mate with at least one functional module each having a first form; and
   a second adapter having a coupling at an attachment end and a module receiving end configured to mate with at least one functional module each having a second form different than said first form such that said module receiving end of said second adapter is different than said module receiving end of said first adapter, said couplings of said first and second adapters being the same such that said first and second adapters are insertable via their attachment ends into engagement with each of the plurality of identical connectors of the chassis of the automated test system alternatingly or with respective first and second ones of the plurality of identical connectors of the chassis of the automated test system at the same time to thereby electrically connect the at least one functional module having the first form and the at least one functional module having the second form to the chassis at the same time.

12. The set of adapters of claim 11, wherein said module receiving end of said first adapter is configured to mate with a VXI module such that the VXI module constitutes the at least one functional module having the first form.

13. The set of adapters of claim 11, wherein said module receiving end of said second adapter is configured to mate with at least one PXI module such that the at least one PXI module constitutes the at least one functional module having the second form.

14. The set of adapters of claim 11, wherein said module receiving end of said second adapter has a plurality of electrical connectors and is configured to mate simultaneously with a plurality of the same functional modules of the second form each being connectable to a respective one of the plurality of electrical connectors at said module receiving end of said second adapter.

15. The set of adapters of claim 11, wherein said first adapter has different signal processing circuitry than signal processing circuitry of said second adapter, said signal processing circuitry of said first and second adapters being related to the form of functional module mating with said first or second adapter.

16. The set of adapters of claim 15, wherein said module receiving end of said first adapter is configured to mate with a VXI module such that the VXI module constitutes the at least one functional module having the first form, and said signal processing circuitry of said first adapter is configured to terminate signals other than those necessary for use of the VXI module.

17. The set of adapters of claim 15, wherein said module receiving end of said second adapter is configured to mate with at least one PXI module such that the at least one PXI module constitutes the at least one functional module having the second form, and said signal processing circuitry of said second adapter is configured to terminate signals other than those necessary for use of the PXI modules.

18. A chassis for an automated test system, comprising:
a housing;
a plurality of identical connectors, each having a unique identification;
a backplane in said housing including electrical connectors for a plurality of functional modules of different forms and having different supporting signals, said backplane including electrical circuitry to enable signals to be provided simultaneously for all of the functional modules when, at the same time, the functional modules are each engaged with a respective one of said connectors, said backplane further comprising common signal lines additional to a minimum number of signal lines needed to support all of the functional modules when each is engaged with a respective one of said connectors, and said backplane is configured to provide an address bus, a data bus, a trigger bus, an interrupt bus, a local bus, clock and power signals and slot identification signals and to source all voltages required by the functional modules when each is engaged with a respective one of said connectors; and
a cooling system configured to satisfy cooling requirements of the functional modules when, at the same time, the functional modules are each engaged with a respective one of said connectors, said cooling system including at least one passage through which air is conveyable to an opening of the chassis leading to a location alongside the functional modules when, at the same time, the functional modules are each engaged with a respective one of said connectors to thereby enable air flow through said chassis to cool the functional modules.

19. The chassis of claim 18, wherein said backplane includes a plurality of slots alongside one another and in which said connectors are arranged and said at least one passage comprises an elongate module passage that aligns with a respective one of said slots.

20. The chassis of claim 18, wherein said backplane includes a plurality of slots alongside one another and in which said connectors are arranged and said at least one passage comprises a plurality of elongate module passages spaced apart from one another and each aligning with a respective one of said slots.

* * * * *

UNITED STATES PATENT AND TRADEMARK OFFICE
CERTIFICATE OF CORRECTION

PATENT NO.         : 9,295,169 B1
APPLICATION NO.    : 14/487851
DATED              : March 22, 2016
INVENTOR(S)        : Spinner et al.

It is certified that error appears in the above-identified patent and that said Letters Patent is hereby corrected as shown below:

In the Claims
Column 12, line 27, claim 8, before "said chassis", delete "the".
Column 12, line 34, claim 9, before "said chassis", delete "the".

Signed and Sealed this
Twenty-fourth Day of May, 2016

Michelle K. Lee
*Director of the United States Patent and Trademark Office*